(12) United States Patent
Shi et al.

(10) Patent No.: US 12,089,056 B2
(45) Date of Patent: Sep. 10, 2024

(54) DEVICE COMMUNICATION OVER TELEVISION WHITE SPACE

(71) Applicant: Microsoft Technology Licensing, LLC, Redmond, WA (US)

(72) Inventors: Heping Shi, Bellevue, WA (US); Ranveer Chandra, Kirkland, WA (US); Tusher Chakraborty, Bangalore (IN); Nissanka Arachchige Bodhi Priyantha, Redmond, WA (US); Zerina Kapetanovic, Seattle, WA (US); Binh Ngoc Vu, Bellevue, WA (US)

(73) Assignee: Microsoft Technology Licensing, LLC., Redmond, WA (US)

( * ) Notice: Subject to any disclaimer, the term of this patent is extended or adjusted under 35 U.S.C. 154(b) by 0 days.

(21) Appl. No.: 18/457,317

(22) Filed: Aug. 28, 2023

(65) Prior Publication Data

US 2023/0403567 A1 Dec. 14, 2023

Related U.S. Application Data

(60) Division of application No. 17/849,562, filed on Jun. 24, 2022, now Pat. No. 11,778,481, which is a
(Continued)

(30) Foreign Application Priority Data

May 15, 2020 (IN) .............................. 202041020661

(51) Int. Cl.
*H04W 16/14* (2009.01)
*H03F 3/19* (2006.01)
(Continued)

(52) U.S. Cl.
CPC .............. *H04W 16/14* (2013.01); *H03F 3/19* (2013.01); *H04W 48/16* (2013.01);
(Continued)

(58) Field of Classification Search
CPC ............ H04L 27/06; H04N 5/44; H04N 5/50; H04W 16/14; H04W 56/00;
(Continued)

(56) References Cited

U.S. PATENT DOCUMENTS

| | | | |
|---|---|---|---|
| 10,389,395 B1 * | 8/2019 | Hovda | ................. H04B 1/1018 |
| 2014/0051469 A1 * | 2/2014 | Kasslin | ..................... H04L 1/00 |
| | | | 455/509 |
| 2017/0238189 A1 * | 8/2017 | Nolan | ................... H04W 16/14 |
| | | | 370/328 |

* cited by examiner

*Primary Examiner* — Tu X Nguyen
(74) *Attorney, Agent, or Firm* — Foley IP Law, PLLC

(57) ABSTRACT

The disclosure described herein configures a multi-narrowband transceiver for communication within the television white space (TVWS) frequency spectrum using a log periodic filter, wherein the log periodic filter comprises a plurality of filter elements each having a filter frequency increasing periodically in a same frequency increasing factor (K). Each filter of the plurality of filter elements is configured to filter out second harmonics in a defined frequency range. The disclosure determines a TVWS channel for the communication and switches to a filter element of the plurality of filter elements corresponding to the determined TVWS channel. Data is transmitted and/or received over the TVWS channel using the filter element, thereby allowing narrowband communication over the TVWS channel.

20 Claims, 8 Drawing Sheets

Related U.S. Application Data continuation of application No. 17/037,389, filed on Sep. 29, 2020, now Pat. No. 11,405,792.

(51) Int. Cl.
*H04W 48/16* (2009.01)
*H04W 72/0453* (2023.01)
*H04W 72/541* (2023.01)

(52) U.S. Cl.
CPC ..... *H04W 72/0453* (2013.01); *H04W 72/541* (2023.01); *H03F 2200/294* (2013.01)

(58) Field of Classification Search
CPC ......... H04W 72/0446; H04W 72/0453; H04W 76/15; H04W 84/20
See application file for complete search history.

DEVICE COMMUNICATION OVER TELEVISION WHITE SPACE

CROSS-REFERENCE TO RELATED APPLICATION

This application is a divisional of, and claims priority to, U.S. patent application Ser. No. 17/849,562, entitled "DEVICE COMMUNICATION OVER TELEVISION WHITE SPACE," filed on Jun. 24, 2022, which is a continuation of, and claims priority to, U.S. patent application Ser. No. 17/037,389 (now patent Ser. No. 11/405,792), entitled "DEVICE COMMUNICATION OVER TELEVISION WHITE SPACE," filed Sep. 29, 2020, which claims priority to Indian Patent Application No. 202041020661, entitled "Device Communication Over Television White Space", filed May 15, 2020, the entire disclosures of which are incorporated by reference herein.

BACKGROUND

Television (TV) white space (TVWS) is the unused or inactive part of the TV spectrum. TVWS covers a wide spectrum of frequencies in the ultra high frequency (UHF) and very high frequency (VHF) frequency bands. In particular, TVWS corresponds to the unused TV channels between active channels in the UHF and VHF spectrums.

TV channel availability can vary across both space and time. As a result, transceivers communicating using the TVWS spectrum may have to hop between different frequencies. Moreover, the TVWS spectrum is not continuous and single channel capacity using TVWS may not be enough to allow for satisfactory communication between some types of devices, such as Internet of Things (IoT) devices. Additionally, TVWS is sensitive to interference when the signal is low, resulting in use of the TVWS mostly for broadband communication today.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

A computerized method for television white space (TVWS) communication comprises configuring a multi-narrowband transceiver for communication within the TVWS frequency spectrum using a log periodic filter, wherein the log periodic filter comprises a plurality of filter elements each having a filter frequency increasing periodically in a same frequency increasing factor (K). Each filter of the plurality of filter elements is configured to filter out second harmonics in a defined frequency range. The computerized method further comprises determining a TVWS channel for the communication and switching to a filter element of the plurality of filter elements corresponding to the determined TVWS channel. The computerized method also includes at least one of transmitting and receiving over the TVWS channel using the filter element.

Many of the attendant features will be more readily appreciated as the same becomes better understood by reference to the following detailed description considered in connection with the accompanying drawings.

BRIEF DESCRIPTION OF THE DRAWINGS

The present description will be better understood from the following detailed description read in light of the accompanying drawings, wherein.

Corresponding reference characters indicate corresponding parts throughout the drawings. In the figures, the systems are illustrated as schematic drawings. The drawings may not be to scale.

DETAILED DESCRIPTION

The computing devices and methods described herein are configured to communicate using the television (TV) white space (TVWS) spectrum. With the disclosure, communication between endpoint devices (e.g., clients) and a corresponding base station for use in an edge Internet of Things (IoT) environment makes use of the TVWS spectrum without having the limitations typically introduced when communicating using the TVWS, in various examples.

The endpoint device includes a multi-narrowband radio configured within a Long Range (LoRa®) protocol or network, which is a low-power wide-area network (LPWAN) protocol that uses spread spectrum modulation techniques. While aspects of the disclosure are described with reference to LoRa®, the disclosure is operable with other forms of long range protocols or networks. For example, different long range protocols can be used that allow for communication over longer distances (e.g., ten kilometers or more). With the disclosure, a log periodic filter is configured for communication within the TVWS spectrum to allow for narrowband longer range transmissions having lower power consumption. As a result, devices that otherwise cannot be satisfactorily used for such environments (e.g., IoT devices) are configured to use the TVWS spectrum for longer range, higher capacity, lower power consumption communications (e.g., communication in remote locations).

For example, with the present disclosure, IoT devices are able to operate at the lower frequencies in the TVWS (within the UHF and VHF bands) and for longer range communications (e.g., tens of miles), while providing large amounts of bandwidth, which can be 6 megahertz (MHz) per TV channel in some configurations. As such, a single TVWS base station can support large-scale IoT at very long-range when configured according to the present disclosure.

Figure 1:
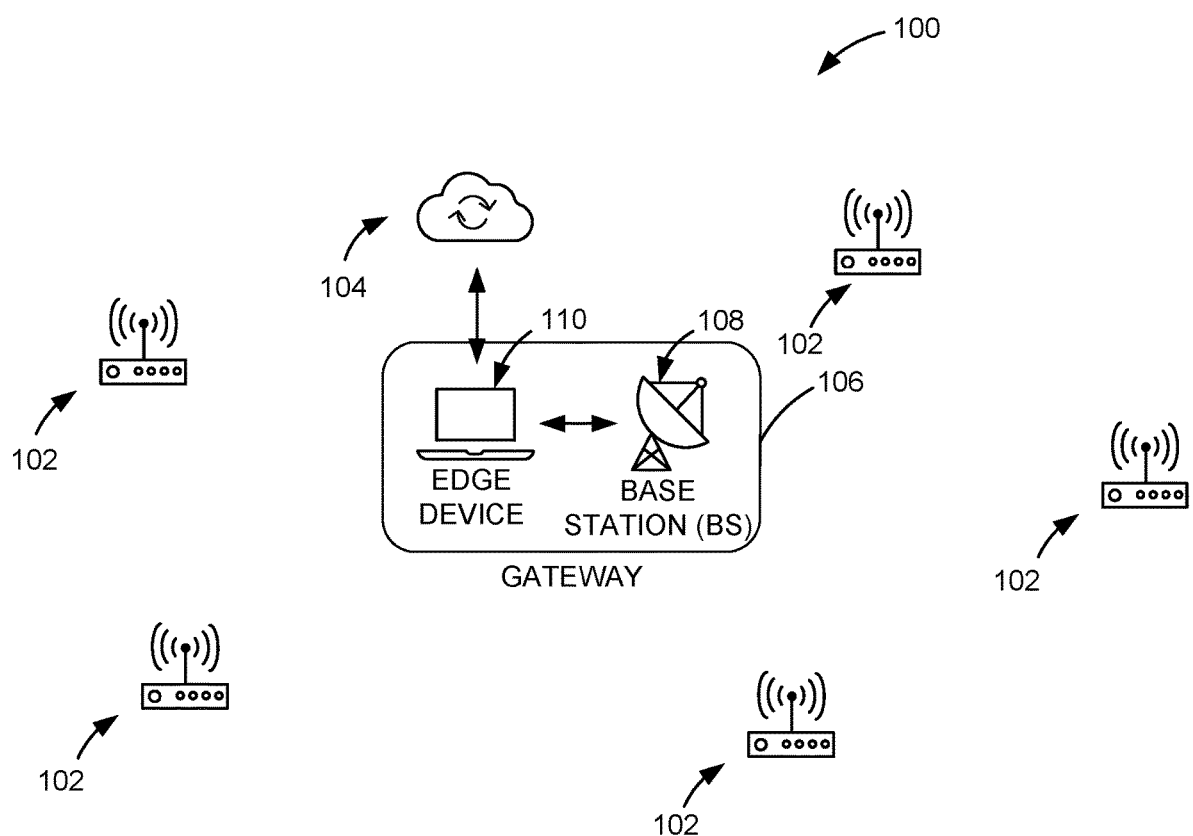
FIG. 1 is a block diagram illustrating communication between a base station and clients according to an example.

FIG. 1 illustrates a system 100 in accordance with one example. The system 100 allows a plurality of clients 102, such as IoT devices, to communicate with a cloud-based device 104 through a gateway 106. For example, the clients 102 can be co-located (at least part of the time) and are configured to communicate locally over one or more local networks using the TVWS and ultimately can communicate with external devices, such as cloud-based devices 104, via one or more external networks through the gateway 106. In the illustrated example, the system 100 is configured as a TVWS network that allows for communication between, for example, IoT devices.

Figure 2:
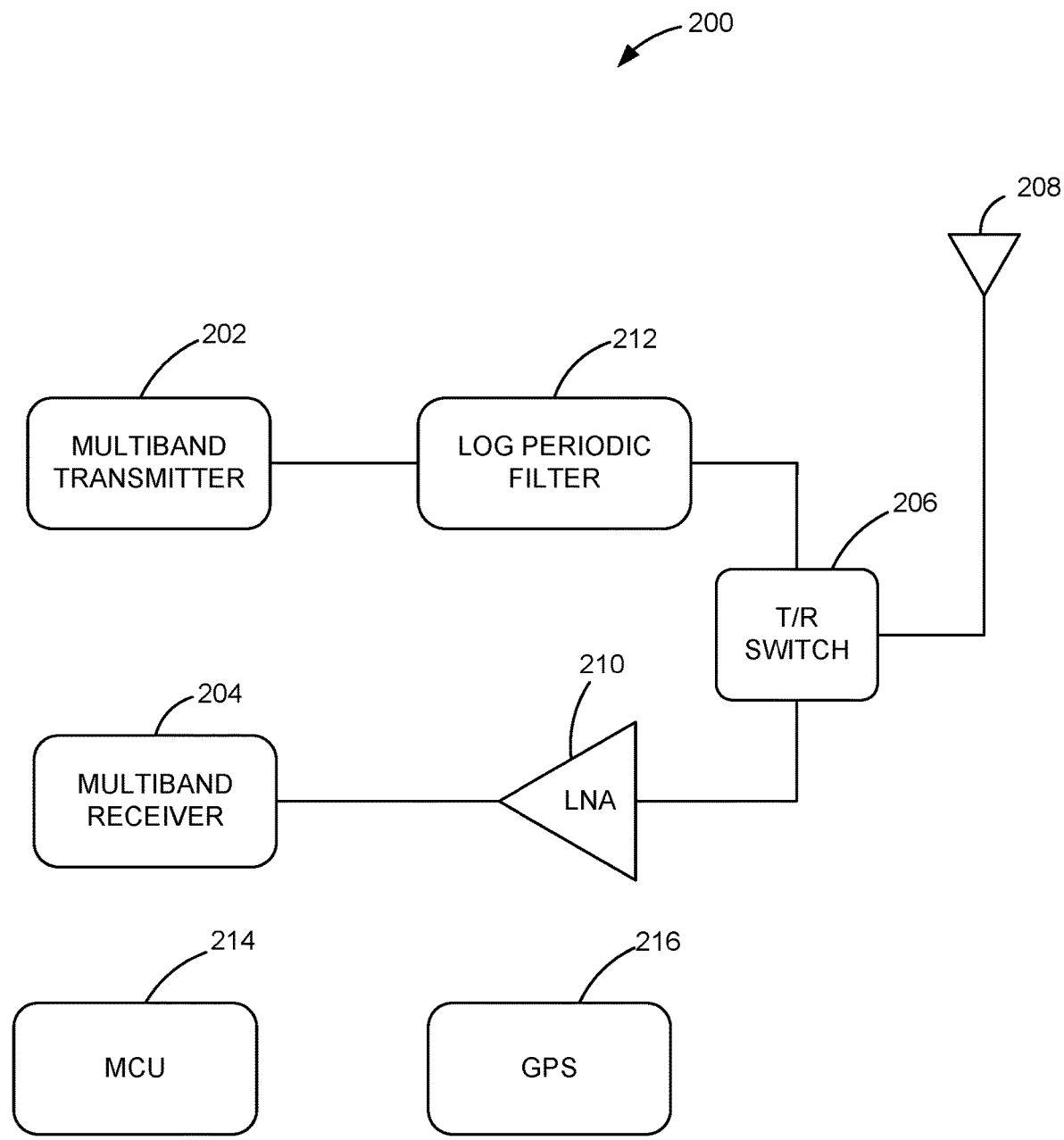
FIG. 2 is a block diagram of a multi-narrowband transceiver according to an example.

The gateway 106 includes a base station 108 and an edge device 110 in the illustrated example. The base station 108 is configured such that a plurality of multi-narrowband transceivers 200 (one is shown in FIG. 2) are configured to communicate over the TVWS and use the long range communication protocol (e.g., LoRa® protocol) as described in more detail herein. For example, the base station is configured to have a working frequency from 150 MHz to 960 MHz, which covers most VHF and UHF TV channels, 433 MHz, 800/900 MHz ISM band (i.e., industrial, scientific, and medical band) and/or other licensed frequency bands. It should be noted that the transceivers are used in the base station 108 and the clients 102, which allows for TVWS network communication. In one example, the communication and control ports include one or more of: universal asynchronous receiver/transmitter (UART), universal synchronous/asynchronous receiver/transmitter (USART), universal serial bus (USB), serial peripheral interface (SPI), and/or multiple general purpose input/output (GPIO).

The one or more multi-narrowband transceivers 200 are configured in some examples to operate using time division multiple access (TDMA) for each frequency if a single multi-narrowband transceiver 200 is used. If multiple multi-narrowband transceivers 200 are used, frequency division multiple access (FDMA) is used. The edge device 110 is configured to allow computer control and transfer of data from each transceiver to the cloud-based device 104. It should be noted that a combination of TDMA and FDMA is used in some examples. In one example, hardware provides spectrum/interference sensing function as described in more detail herein. The one or more multi-narrowband transceivers 200 are configures as one or more sub-modules in some examples.

In an IoT environment, the edge device 110 performs processing at the "edge" of the network (e.g., within the gateway 106). Thus, in one example, the processing for performing transmission is done by the gateway 106. However, the edge device 110 or the computing to perform TVWS communication as described herein, in some examples, is performed (or partially performed) at any location near the gateway 106, which is not necessarily within the gateway 106 (e.g., a local computing device connected to the gateway 106). As such, the processing or partial processing to allow for TVWS transmission in these examples is performed outside of the gateway 106.

The base station 108 includes a global positioning system (GPS) device that provides location information. As described in more detail herein, the location information is used when configuring communication between the devices. The base station 108 is powered using one or more power sources, such as a power over ethernet (PoE) power supply in some examples, or other suitable sources of power.

Similarly, each of the clients 102 includes one or more multi-narrowband transceivers 200. The clients 102 also include an interface extension board and connect to different sensors (e.g., IoT type sensors) in some examples. It should be noted that power for each of the clients can be provided using a solar panel, a battery (e.g., direct current), or alternating current (AC) power, among others. The power source is selected in some examples based on the application or environment in which the client 102 operates.

Thus, devices in the system 100 are configured to form a TVWS IoT network in some examples. As illustrated in FIG. 2, and described in more detail below, the multi-narrowband transceivers 200 are configured with long range communication technology (e.g., (LoRa®) to communicate over the TVWS spectrum, having global positioning system (GPS) functionality on board of one or more of the multi-narrowband transceivers 200, as well as spectrum/interference sensing.

More particularly, as shown in FIG. 2, the multi-narrowband transceiver 200 is configured as a multi-narrowband radio operating using a long range communication protocol (e.g., LoRa® protocol) and TVWS frequency spectrum. In one example, the multi-narrowband transceiver 200 is configured to operate in the 150 MHz to 960 MHz frequency band. However, different frequency bands and ranges are contemplated.

The multi-narrowband transceiver 200 includes a multiband transmitter 202 and a multiband receiver 204 that enable multi-narrowband communication over the TVWS frequency spectrum as described herein. A transmit/receive (T/R) switch 206 is connected to an antenna 208 to allow for transmission and reception using the multiband transmitter 202 and the multiband receiver 204. That is, the T/R switch 206 is configured to selectively connect to one of the multiband transmitter 202 or the multiband receiver 204 to enable transmission or reception by the multi-narrowband transceiver 200. Thus, in operation, the T/R switch 206 switches between transmit or receive, wherein multiple multiband transmitters 202 can transmit during a transmit time or slot (transmit-T) in examples where the multiband transmitters 202 are configured to operate in different frequency bands. Similarly, multiple multiband receivers 204 can receive during a receive time or slot (receive-R) in examples where the multiband receivers 204 are configured to operate in different frequency bands.

On the receive side (receive path), a low-noise amplifier (LNA) 210 is connected between the multiband receiver 204 and the T/R switch 206. The LNA 210 is configured to amplify signals received by the antenna 208, including reducing unwanted noise. For example, the LNA 210 is configured to operate according to noise reduction techniques in the radio transmission technology. In one example, the LNA 210 is configured to amplify a very low-power signal from the antenna 208 without significantly degrading its signal-to-noise ratio. That is, the LNA 210 increases the power of both the signal and the noise, while minimizing the additional noise. In operation, the LNA 210 is configured to provide signal matching using signal matching techniques in the radio technology. It should be noted that any suitable reception technique in the radio transmission technology can be used. Thus, in the receive path, the LNA 210 (e.g., wideband LNA) operates to compensate for the matching loss of the narrow-band input of the multiband receiver 204. It should be noted that the LNA 210 is not used if the receiver input is wideband matched.

On the send side (transmit path), a log periodic filter 212 is connected between the multiband transmitter 202 and the T/R switch 206. For example, the log periodic filter 212 is configured to suppress second harmonics (i.e., filter out second harmonics). With the present disclosure, suppression of the harmonics, particularly second harmonics, is performed using different filters. That is, different filters are used to filter out harmonics at different frequencies. An example of the log periodic filter 212 having a plurality of filters 300 is illustrated in FIG. 3.

Figure 3:
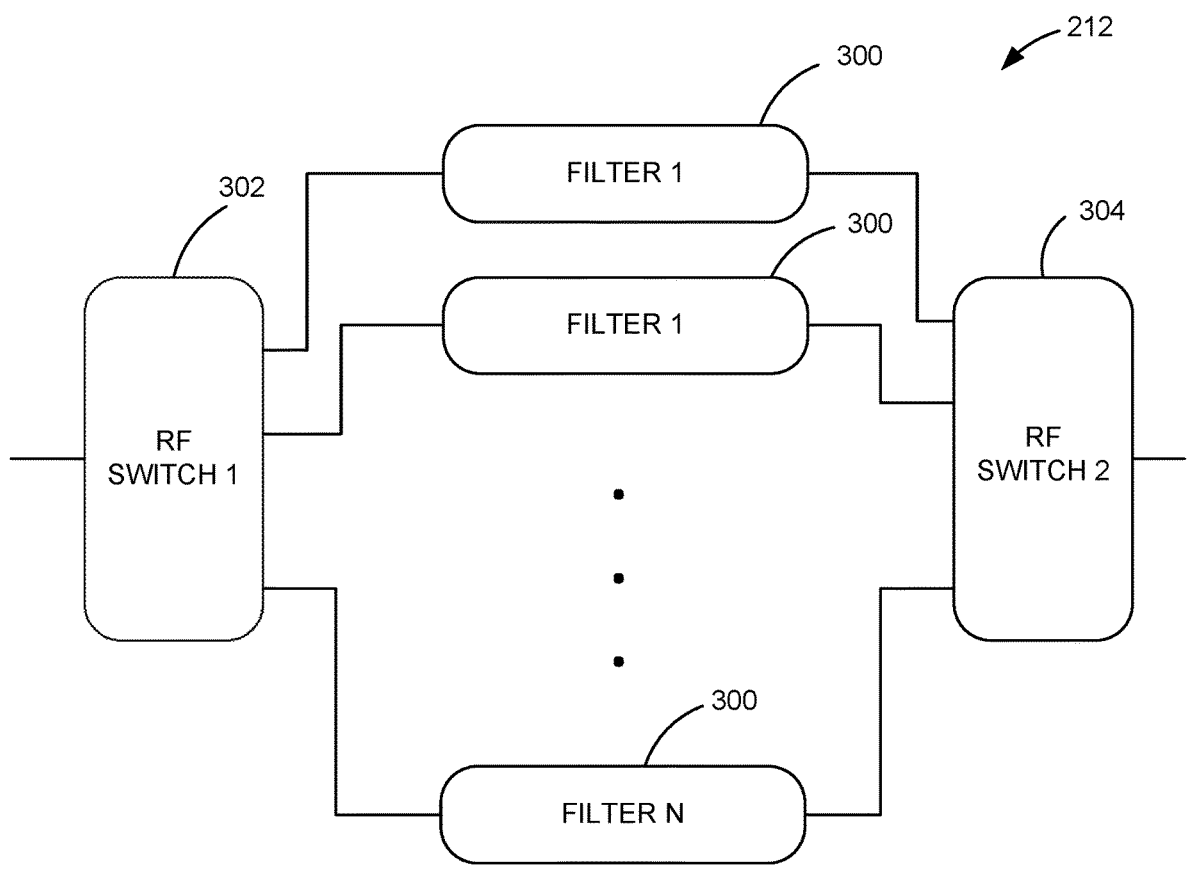
FIG. 3 is a block diagram of log periodic filter of the multi-narrowband transceiver of FIG. 2.

As shown in FIG. 3, a plurality of filters 300 is connected between a first radio frequency (RF) switch 302 and a second RF switch 304. The first and second RF switches 302, 304 are configured to route signals through one of the filters 300 based on a frequency of the signal. That is, the first and second RF switches 302, 304 define transmission paths for signals of different frequencies within the TVWS frequency spectrum to be filtered through one of the filters 300 to remove second harmonics. The first and second RF switches 302, 304 are configured to operate using switching techniques in the RF switching technology.

In one example, and in operation, the multiband transmitter 202 and the multiband receiver 204 are configured using a long range communication protocol device (e.g., an SX1262 LoRa® transceiver or other long range low power transceiver) to communicate within a frequency range of 150 MHz to 960 MHz. As a result of the multiband transmitter 202 being low power, filtering is performed by the filters 300 to suppress the second harmonics. As described below, the configuration and number of filters 300 of the log periodic filter 212 is selected to maintain similar filter specifications, while reducing the number of filters 300 used, thereby reducing complexity and cost. Filtering is performed in various examples because receiver matching is narrowband and cannot work in such a wide spectrum without re-matching. Thus, the present disclosure provides multifilters for switching, which in one example, has a filter frequency increasing periodically with a same frequency increasing factor (K).

In one implementation, the multi-narrowband transceiver 200 is configured with long range transmission and reception capabilities using the log periodic filter 212. The filter frequencies of the filters 300 (defining filter elements) are calculated using the following example equations:

$$N = \left( \frac{\log \frac{f_{n+1}}{f_1}}{\log K} \right) \quad \text{Eq. 1}$$

$$K = \left( \frac{f_{n+1}}{f_1} \right)^{\frac{1}{n}} \quad \text{Eq. 2}$$

wherein N is the number of filters, K is a frequency increasing factor, and $f_1$ is the starting frequency of filter 1 (sub-band 1). For the other frequencies, $f_2$ is the ending frequency of filter 1 (sub-band 1) and starting frequency of filter 2 (sub-band 2), and the ending frequency $f_{n+1}$ is the ending frequency of the band.

In various examples, K is the ratio of the ending frequency to the starting frequency of the sub-band (e.g., $K=f_{i+1}/f_i$), wherein $f_{i+1}$ is the ending frequency of the sub-band i and $f_i$ is the starting frequency of the sub-band i. The present disclosure is operable with examples in which the spectrum may not be continuing, such as if a designer wants to just cover the TV band and not cover a licensed band, filter 3 can be removed. Further, as described in more detail herein, K (ending frequency/starting frequency) is the same for all filters 300.

The value of K in some examples is determined by simulation. For example, K depends on the type of filter. When determining K, the following rule is used in one example: in the pass band of the filter, the filter has less attenuation, and in the stop band (the second harmonics and higher order harmonics located), the filter has attenuation configured to suppress harmonics. It should be noted that there are trade-offs among pass band attenuation (the lower the better), stop band attenuation (the higher the better), and cost.

In one case, for example, a suitable K is determined to be 1.48. In some examples, K is determined as follows: using Eq. 1, N, is calculated, which is N=4.73 in this example. Then a value for N is set, for example, N=5 (N must be an integer) and the value of N is inserted in Eq. 2 to calculate K, which is 1.45 in this example. K is used to calculate the ending frequency of each sub-band. The ending frequency is also the starting frequency of the next sub-band in a continuous spectrum. In the case that the spectrum is not continuous, then that portion of the spectrum is skipped. The filter and matching circuit are then optimized to make the harmonics meet Federal Communication Commission (FCC) requirements.

In one example, the log periodic filter 212 includes only five filters 300 (also referred to as filter elements), which was determined by simulation (e.g., to determine N and K) to be the optimized number of filters 300 for the TVWS frequency spectrum. In this configuration, N=5 and K=1.45, with the five filters 300 operating in the following frequency ranges:
Filter 1—150 MHz-217 MHz;
Filter 2—217 MHz-315 MHz;
Filter 3—315 MHz-458 MHz;
Filter 4—458 MHz-667 MHz; and
Filter 5—667 MHz-960 MHz.

It should be noted that in various examples, K is limited to be less than 2. As should be recognized, for low-pass or bandpass filtering, the starting and ending frequencies are less than one octave band in order to filter out the second harmonics. That is, the wide spectrum is divided into sub-bands defined by the starting and ending frequency of each filter. With the sub-bands selected, in some examples, the filters are optimized to filter harmonics, particularly second harmonics, such as to meet FCC requirements.

The filters 300 in one example are low-pass filters (LPFs), such as a Butterworth-type filter or a Chebyshev-type filter. However, other types of filters can be used. For example, in some implementations, the filters 300 are bandpass filters (BPFs). In operation, software of firmware is programmed to control the switching to one of the filters 300 based on a detected signal frequency. That is, the appropriate filter 300 is selected based on a signal frequency to use the filter 300 to suppress the second harmonics (e.g., select one of Filters 1-5 based on the frequency of the signal). The operating frequency range of each of the filters 300 is thereby optimized to divide the frequency band to each filter 300 (e.g., each LPF), wherein all frequency bands have the same K factor and the number of filters is minimized.

Thus, the present disclosure enables narrowband transmissions operating in the TVWS frequency spectrum, with harmonic suppression techniques that allows for compliance with communication requirements (e.g., FCC requirements). The filtering techniques described herein allow for the use of long range (e.g., LoRa®) transceivers having power amplifiers with low linearity (to increase power-added efficiency (PAE), thereby reducing power consumption) in the TVWS frequency spectrum. The present disclosure allows for narrowband communication in the TVWS while suppressing harmonics, particularly second harmonics, unlike conventional low pass filters that cannot meet the suppression requirements for the TVWS frequency spectrum, including the 800/900 ISM band.

The multi-narrowband transceiver 200 also includes a microcontroller, illustrated as a microcontroller unit (MCU) 214. The MCU 214 is configured to control operation of the multi-narrowband transceiver 200, including communication within the multi-narrowband transceiver 200. The multi-narrowband transceiver 200 also includes a GPS 216 to determine the location of the multi-narrowband transceiver 200. The GPS 216 allows for the multi-narrowband transceiver 200 to operate within the TVWS frequency range. That is, GPS location information is needed for TVWS devices (e.g., an FCC requirement for TVWS devices).

With particular reference now to the base station 108 (shown in FIG. 1), in one example, the base station 108 is a multi-transceiver base station. That is, the base station 108 is configured having multiple multi-narrowband transceivers 200 in one example. However, in some examples, the base station 108 includes a single multi-narrowband transceiver 200.

Figure 4:
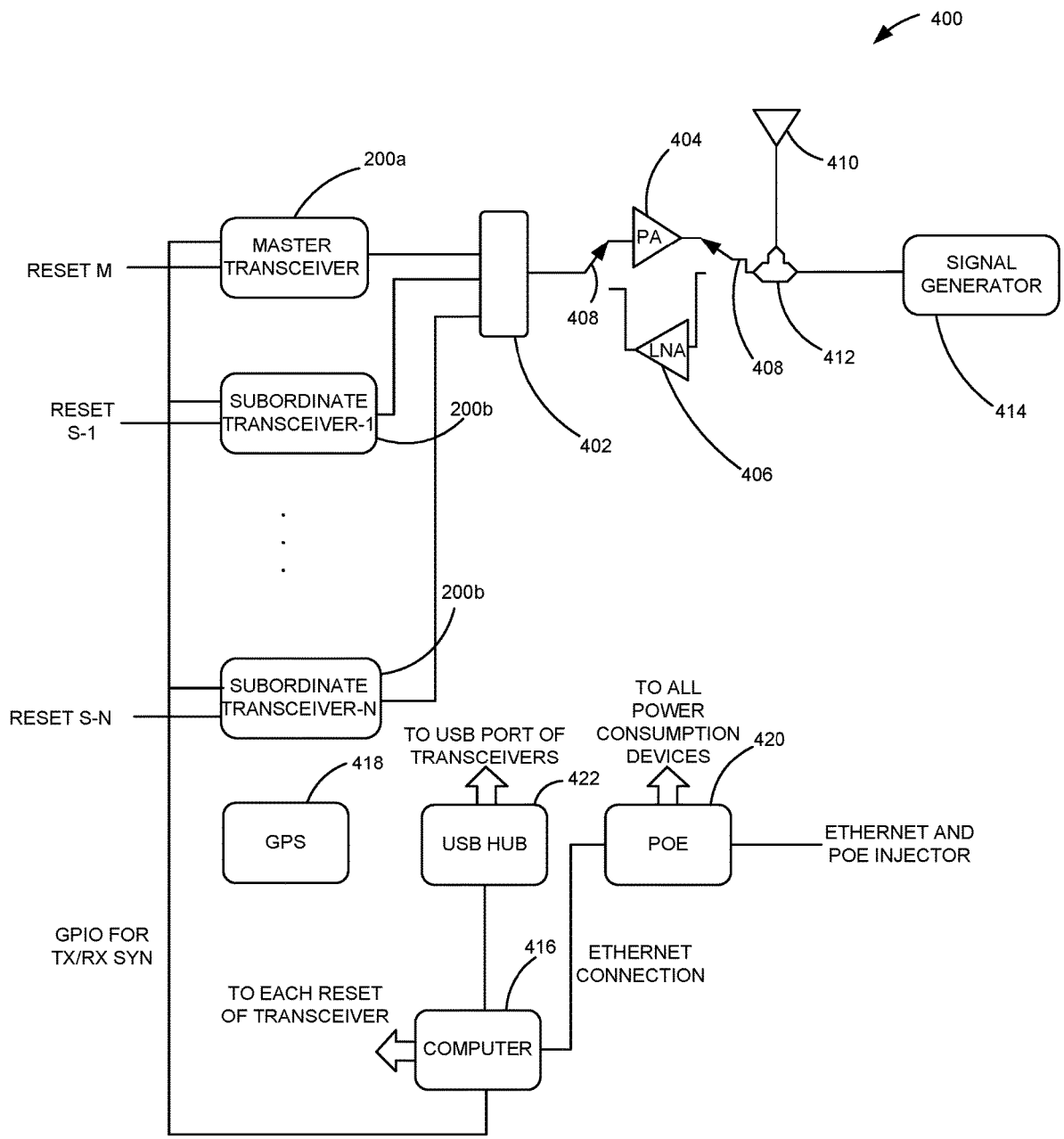
FIG. 4 is a block diagram of a base station according to an example.

FIG. 4 illustrates a multi-transceiver base station 400 that is embodied as the base station 108 in some examples. The multi-transceiver base station 400 includes a plurality of multi-narrowband transceivers 200 configured in a master-subordinate arrangement. In the illustrated example, a master multi-narrowband transceiver 200a and a plurality of subordinate multi-narrowband transceivers 200b (also known as slave multi-narrowband transceivers) are controlled to allow communication with a plurality of clients 102 within different frequency ranges of the TVWS frequency spectrum.

In the illustrated example, the multi-narrowband transceivers 200 are connected to a multiplexer 402 to allow multiplexing of the multiple signals from the multi-narrowband transceivers 200. The multiplexer 402 is configured as an RF power combiner in one example, and/or an RF power splitter, depending on whether signal transmission or reception is occurring. That is, the multiplexer 402 is configured to receive an input signal and output multiple output signals with specific output phase and amplitude characteristics. For example, a single RF line is split into multiple lines and the power output is divided between the lines, and/or more than one feed line is combined into a single RF line, depending on whether the signal are being received or sent by the multi-narrowband transceivers 200, respectively. In one example, the multiplexer 402 is configured as an RF combiner/splitter, wherein the multiplexer 402 operates as a combiner or splitter based on whether transmit operations or receive operations are being performed. It should be appreciated that the multiplexer 402 can be any type of RF multiplexer or analog type RF combiner/splitter, for example.

A power amplifier (PA) 404 and an LNA 406 are connected to the multiplexer 402. The PA 404 and LNA 406 are configured to compensate for signal loss of the multiplexer 402. That is, the PA 404 and LNA 406 are configured to compensate for signal loss as a result of RF power splitting or RF power dividing. As can be seen, a pair of T/R switches 408 are connected between the PA 404 and LNA 406 and the multiplexer 402 on one end and between the PA 404 and LNA 406 and an antenna 410 on the other end. That is, the T/R switches 408 enable selection of the PA 404 or LNA 406 based on whether signals are being transmitted or received by the multi-narrowband transceivers 200.

In the illustrated example, a combiner, which is configured as a multi-carrier power amplifier 412, is connected between the PA 404 and LNA 406, the antenna 410, and a signal generator 414. As will be described in more detail below, the signal generator 414 with the multi-carrier power amplifier 412 allows for transmission and reception of the multiple signals at the same time using the multi-narrowband transceivers 200 that allows for spectrum/interference sensing. That is, the multi-carrier power amplifier 412 supports multiple air interfaces simultaneously on a frequency band. In operation, this allows for the communication of the base station 108 with a plurality of the clients 102 simultaneously or concurrently.

In one configuration, one input/output (I/O) of each of the multi-narrowband transceivers 200 are connected together. For example, a general-purpose input/output (GPIO) pin of each of the multi-narrowband transceivers 200 are connected together to allow communication there between. The interconnection of the multi-narrowband transceivers 200 is configured to allow synchronization of the operations of the multi-narrowband transceivers 200. In one example, the interconnected GPIO pins of the multi-narrowband transceivers 200 are assigned for synchronization operations.

In the illustrated example, the multi-narrowband transceiver 200a is assigned as the master device and the multi-narrowband transceivers 200b are assigned as subordinate devices (also known as slave devices) to the multi-narrowband transceiver 200a. The multi-narrowband transceiver 200a is configured to send transmit and receive control signals to the multi-narrowband transceivers 200b, that is, to all of the subordinate multi-narrowband transceivers 200b to control simultaneous operation of the multi-narrowband transceivers 200 (e.g., simultaneous send operations of the multi-narrowband transceivers 200). In one example, all of the multi-narrowband transceivers 200 are configured to transmit or receive, namely to performing transmission or reception operations, in the same time slot, which eliminates interference between the multi-narrowband transceivers 200. It should be appreciated that in some examples, all of the transceivers 200a and 200b are subordinate devices controlled by a computer (e.g., the computer 416 shown in FIG. 4) sends transmit and receive control signals to all of the transceivers 200a and 200b). In other examples, the computer 416 monitors the transmit and received status, and the transceivers 200a sends transmit and receive control signals to the transceivers 200b.

In operation, in one example, each of the multi-narrowband transceivers 200 is configured to operate using time-division multiple access (TDMA) with synchronization of transmit and receive operation through the interconnection of the GPIO pins. The synchronization operations are performed on the medium access control (MAC) level or layer in one example. Accordingly, the GPIO of the multi-narrowband transceiver 200a sends transmit or receive control signals to the multi-narrowband transceivers 200b such that all of the multi-narrowband transceivers 200 (master and subordinates) transmit or receive at the same time. In one implementation, the transmit/receive (TX/RX) signal is a digital 0 or 1 to indicate a transmit or receive operation. In response, the T/R switches 408 are switched to a corresponding transmit or receive position. Thus, the multi-narrowband transceiver 200a controls when the multi-narrowband transceivers 200b (as well as the multi-narrowband transceiver 200a) transmit or receive.

It should be appreciated that other control schemes for the master-subordinate relationship can be used. In another example, the TX/RX signal is an analog high/low signal, namely a high voltage signal (e.g., +5V) and a low voltage signal (e.g., +1V). With this control scheme, a high voltage signal indicates that the multi-narrowband transceivers 200b should switch to a transmit mode and the multi-narrowband transceivers 200b thereafter operate for transmission. The low voltage signal indicates that the multi-narrowband transceiver 200b should switch to a receive mode and the multi-narrowband transceivers 200b thereafter operate for reception (e.g., a listen mode).

In one example, each of the multi-narrowband transceivers 200 is enabled to operate at different frequencies, for example, within one of the five filter frequency ranges as described herein. In some examples, TDMA is used to further expand the capabilities of communication over a particular channel. That is, for a given channel (frequency), TDMA is used to accommodate more devices.

The control scheme also includes a reset capability in some examples. For example, a reset pin of the multi-narrowband transceivers 200 are connected to a GPIO pin of a controller or computer 416. In this configuration, the computer 416 is enabled to control resetting of the multi-narrowband transceivers 200. For example, when a reset operation of the multi-narrowband transceivers 200 is needed (e.g., resynchronization or fault condition), the computer 416 sends a signal to the reset pins of the multi-narrowband transceivers 200. In one example, the reset signal resets all of the multi-narrowband transceivers 200. In other examples, selective ones of the multi-narrowband transceivers 200 can be reset.

Additionally, the base station 108 includes a GPS device 418. As discussed in more detail herein, the GPS device 418 allows for determining location information needed when communicating using the TVWS frequency spectrum. A USB hub 422 is configured to connect the computer 416 to the multi-narrowband transceivers 200 in the illustrated example. However, other connections can be used and are contemplated by the present disclosure. Power is provided using a PoE power supply 420. However, other power supplies can be used and are contemplated by the present disclosure.

Figure 5:
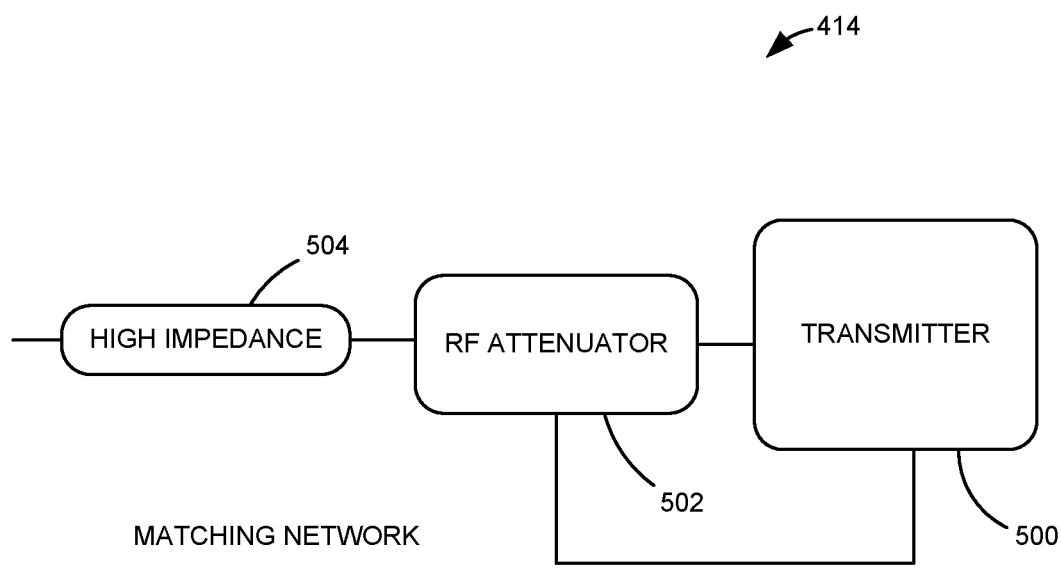
FIG. 5 is a block diagram of a signal generator according to an example.

In some examples, the signal generator 414 is configured to enable spectrum/interference sensing, such as illustrated in FIG. 5. The signal generator 414 is configured to generate signals that allow for spectrum sensing for cognitive radio (CR) to prevent interference (e.g., prevent interference to licensed users). The signal generator 414 allows for high sensitivity spectrum sensing technology that detects the spectrum/interference and evaluates the impact of the interference from licensed and/or unlicensed CR users at very low signal levels. It should be appreciated that this technique can also be used to search for a lowest interference channel in the ISM band.

The signal generator 414 allows for detection of the minimum detectable signal (MDS) of the TVWS narrowband transceiver, as low as −149 dBm, with low power consumption, in one example. This detection is operable for communications in a long-range low data rate network, wherein the working channel can change with location and time. The spectrum sensing of the present disclosure can detect very low-level spectrum energy, as well as evaluate the impact of the interference to communication.

The signal generator 414 is configured as an internal signal generator that simulates the signal of a remote transmitter and uses the antenna 410 to pick up interference. With the herein described configuration, the sensitivity of the interference sensing is the same as the MDS of the transceiver, for example the multi-narrowband transceivers 200, under the interference, and high impedance matching of the internal signal generator minimizes the impact to the antenna matching of the multi-narrowband transceivers 200.

In some examples, channel searching can also be implemented, such as in firmware (e.g., to identify a channel with lower or least interference).

Specifically, and with particular reference to FIGS. 4 and 5, the multi-narrowband transceivers 200, the antenna 410, the multi-carrier power amplifier 412, and signal generator 414 form a spectrum sensing system. It should be appreciated that the multi-carrier power amplifier 412, in one example, is an RF Y connector that connects to the antenna 410, the RF port of the multi-narrowband transceivers 200 and the signal generator 414. The signal generator 414 has high-impedance output terminals that do not affect the antenna matching of the multi-narrowband transceivers 200. In normal use of the multi-transceiver base station 400, the signal generator 414 is inactive (turned off).

In one example, the signal generator 414 includes a transmitter 500 connected to a high impedance matching network 504 through an RF attenuator 502. In operation, spectrum/interference sensing is performed as follows:

A. Control software or firmware (such as from the computer 416) sets one or more of the multi-narrowband transceivers 200 and the signal generator 414 to operate at the same frequency and the same modulation scheme.

B. The signal generator 414 transmits an RF signal, for example, a beacon transmission.

C. The antenna 410 picks up the spectrum/interference, which may be from a primary licensed user, or other unlicensed user. In various examples, both are treated as interference. The interference combines with the RF signal from the signal generator 414 and is fed into a port of one or more of the multi-narrowband transceivers 200. As should be appreciated, higher interference will decrease the carrier-to-interference ratio (C/I). As a result, the MDS of the one or more multi-narrowband transceivers 200 will increase.

D. The transceiver receiver (e.g., the multiband receiver 204 shown in FIG. 2) receives the signal and interference and records the received signal strength indicator (RSSI) and/or signal-to-noise ratio (SNR).

E. The signal generator 414 reduces the strength of the signal and repeats steps B-D until the one or more multi-narrowband transceivers 200 cannot detect the signal. The lowest RSSI is the MDS under the interference level, which indicates the intensity of the interference and the MDS that can be used.

F. Operation is changed to another frequency and operations A-F are performed.

Some of the operations above may be performed in parallel, and in a different order than shown. Further, it should be noted that the transmitter 500 is the same as the multiband transmitter 202 (shown in FIG. 1) in some examples. However, any suitable transmitter can be used. Additionally, RF attenuation by the RF attenuator 502 can be controlled manually, by analog, or digitally. The high impedance matching network 504 (e.g., a resistor) reduces the effect of the signal generator 414 on antenna matching.

Thus, in operation, antenna pick up interference is combined with the signal from signal generator 414 and fed into the multi-narrowband transceivers 200. The signal strength of the signal generator 414 is gradually reduced until the MDS under interference is obtained. The MDS under interference indicates the strength of the interference and the impact on the communication. Spectrum sensing as part of the TVWS IoT network can improve spectrum utilization and improve network stability and reliability.

Thus, the present disclosure allows devices, such as IoT devices, to operate within a TVWS network. For example, various examples described herein can be used in a cloud-backed IoT application. TVWS IoT implemented as described herein allows for a for large-scale IoT deployments (e.g., farming, oil field, gas fields, etc.) and can be backed by cloud and edge devices.

Figure 6:
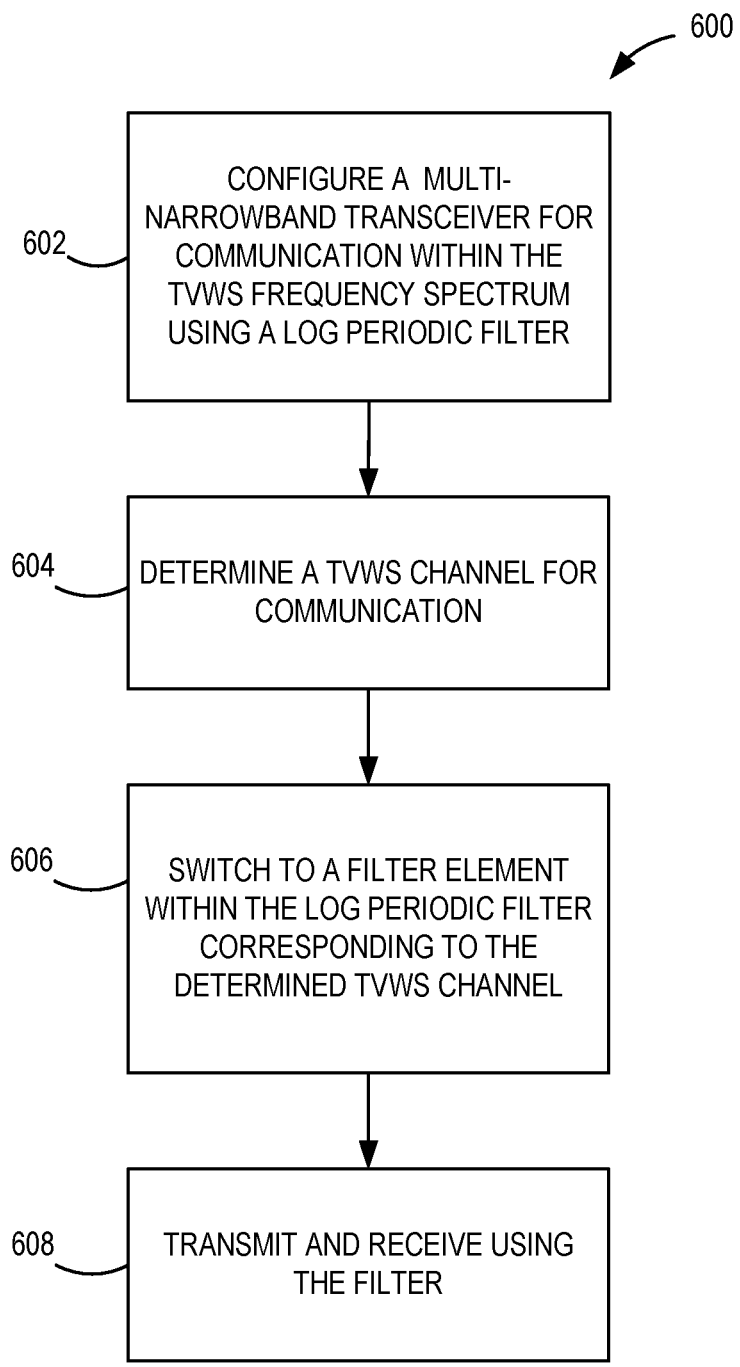
FIG. 6 is a flowchart illustrating operations of a computing device to communicate over a television white space (TVWS) network according to an example.

FIG. 6 is a flowchart of a method 600 illustrating operations of a computing device (e.g., client 102) to communicate over a TVWS network. For example, the method 600 configures a transceiver to allow long range (e.g., LoRa®) communication using the TVWS frequency spectrum. It should be appreciated that the computing device is implementable in different systems and applications. Thus, while the below-described example can be used in connection with an IoT application, the computing device configured according to the present disclosure is useable, for example, in many different applications, including any application using narrowband communication over a TVWS network.

At 602, a multi-narrowband transceiver is configured for communication within the TVWS frequency spectrum using a log periodic filter. For example, as described herein, the multi-narrowband transceiver 200 is configured with the log periodic filter 212 that allows for communication within various frequency ranges of the TVWS frequency spectrum. That is, the log periodic filter 212 includes a plurality of filter elements each optimized to communicate over a range of the TVWS frequency spectrum by using the same K value. The defined ranges for the filter elements are optimized to suppress second harmonics during transmission. In one example, the multi-narrowband transceiver 200 is configured to allow long range communication within the frequency ranges of the TVWS using the log periodic filter.

At 604, a TVWS channel for communication is determined. For example, as described herein, spectrum/interference sensing can be performed to identify an unused channel within the TVWS frequency spectrum. In one example, based on the spectrum/interference sensing (or in some examples the location and known channel usage), an available TVWS frequency is selected having minimal interference. That is, the use of the channel does not interfere with usage by other entities.

At 606, a filter element within the log periodic filter 212 corresponding to the TVWS channel is switched to for use in communication. That is, the filter element operating within a frequency range covering the frequency of the available TVWS frequency that is determined at 604 is activated to filter signals being communicated by the multi-narrowband transceiver 200. In operation, the filter element filters out the second harmonics during transmission using the TVWS channel. In particular, transmission and reception of signals using the TVWS channel is performed at 608 with the signals filtered by the switched to filter element. As a result, optimized TVWS communication is provided in combination with a long communication protocol (e.g., using the LoRa® protocol). For example, devices are thereby configured for operation in a TVWS network.

Figure 7:
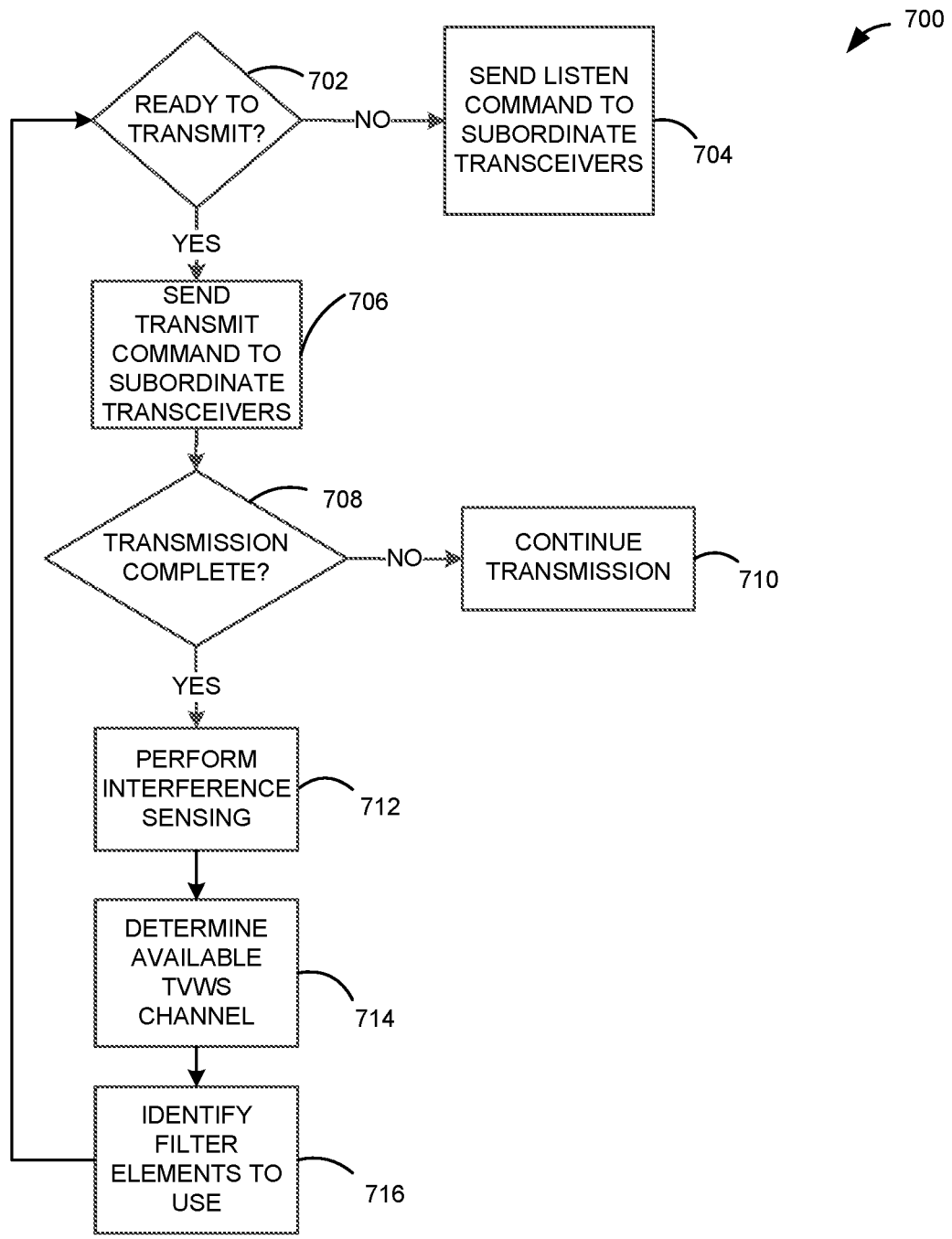
FIG. 7 is flowchart illustrating operations of a computing device to communicate over a TVWS network according to another example.

FIG. 7 is a flowchart of a method 700 illustrating operations of a computing device (e.g., base station 108) to communicate over a TVWS network with a plurality of devices (e.g., clients 102 or IoT devices). For example, the method 700 configures a base station to simultaneously or concurrently communicate with a plurality of devices using multiple frequencies of the TVWS frequency spectrum.

At 702, at determination is made whether the base station or devices are ready to transmit. For example, a determination is made whether communication between a plurality of IoT devices through a base station is to be performed using the TVWS frequency spectrum. If transmission is not going to occur, then the base station is configured to perform listen operations, namely, to be in a receive mode. In this mode, a master transceiver of the base station (e.g., the multi-narrowband transceiver 200a of the base station 108) sends a receive or listen control signal to a plurality of subordinate transceivers (e.g., the multi-narrowband transceiver 200b of the base station 108) at 704. For example, an analog signal (e.g., voltage high or low) or digital signal (e.g., 1 or 0) is sent to each of the subordinate transceivers that are interconnected together and with the master transceiver as described herein (e.g., a GPIO pin). In this mode, all of the transceivers, including the master and subordinate transceivers, are enabled to receive in the same time slot.

If a determination is made that transmission is to occur, then the base station is configured to perform transmit operations, namely, to be in a transmit mode. In this mode, a master transceiver of the base station (e.g., the multi-narrowband transceiver 200a of the base station 108) sends a transmit control signal to a plurality of subordinate transceivers (e.g., the multi-narrowband transceiver 200b of the base station 108) at 706. For example, an analog signal (e.g., voltage high or low) or digital signal (e.g., 1 or 0) is sent to each of the subordinate transceivers that are interconnected together and with the master transceiver as described herein (e.g., a GPIO pin). It should be noted that the control signal for the transmit mode is opposite to the control signal for the listen or receive mode (e.g., low voltage instead of high voltage, or 0 instead of 1). In this mode, all of the transceivers, including the master and subordinate transceivers, are enabled to transmit in the same time slot.

In the receive/listen and transmit modes, a multiplexer, which is configured as an RF combiner or divider is also controlled. In particular, one or more T/R switches (e.g., T/R switches 408) are controlled to select transmit or receive operation via an antenna (e.g., the antenna 410).

At 708, a determination is made if transmission is complete. If transmission is not complete, transmission continues at 710. If transmission is complete, interference sensing is performed at 712. As described herein, a signal generator (e.g., the signal generator 414) is configured to perform spectrum/interference sensing by generating an RF signal for use in determining the lowest RSSI, which identifies the MDS under interference. It should be noted that the signal generator is turned off during normal use (e.g., during transmission and reception).

At 714, one or more available TVWS channels are determined from the interference sensing. For example, based on the RSSI (and/or SNR) determined at 712, one or more TVWS channels are identified that are available for transmission (e.g., below a threshold interference level). The frequency of the available channels allows for the identification of filter elements in the transceivers to use for subsequent transmission at 716. For example, filter elements optimized for long range communication over defined TVWS frequency ranges are identified and the filter element having the determined available channel frequency therein is identified. Thus, a multi-transceiver base station is configured to allow communications over different frequencies in the same time slot, which eliminates interference between the transceivers.

Exemplary Operating Environment

Figure 8:
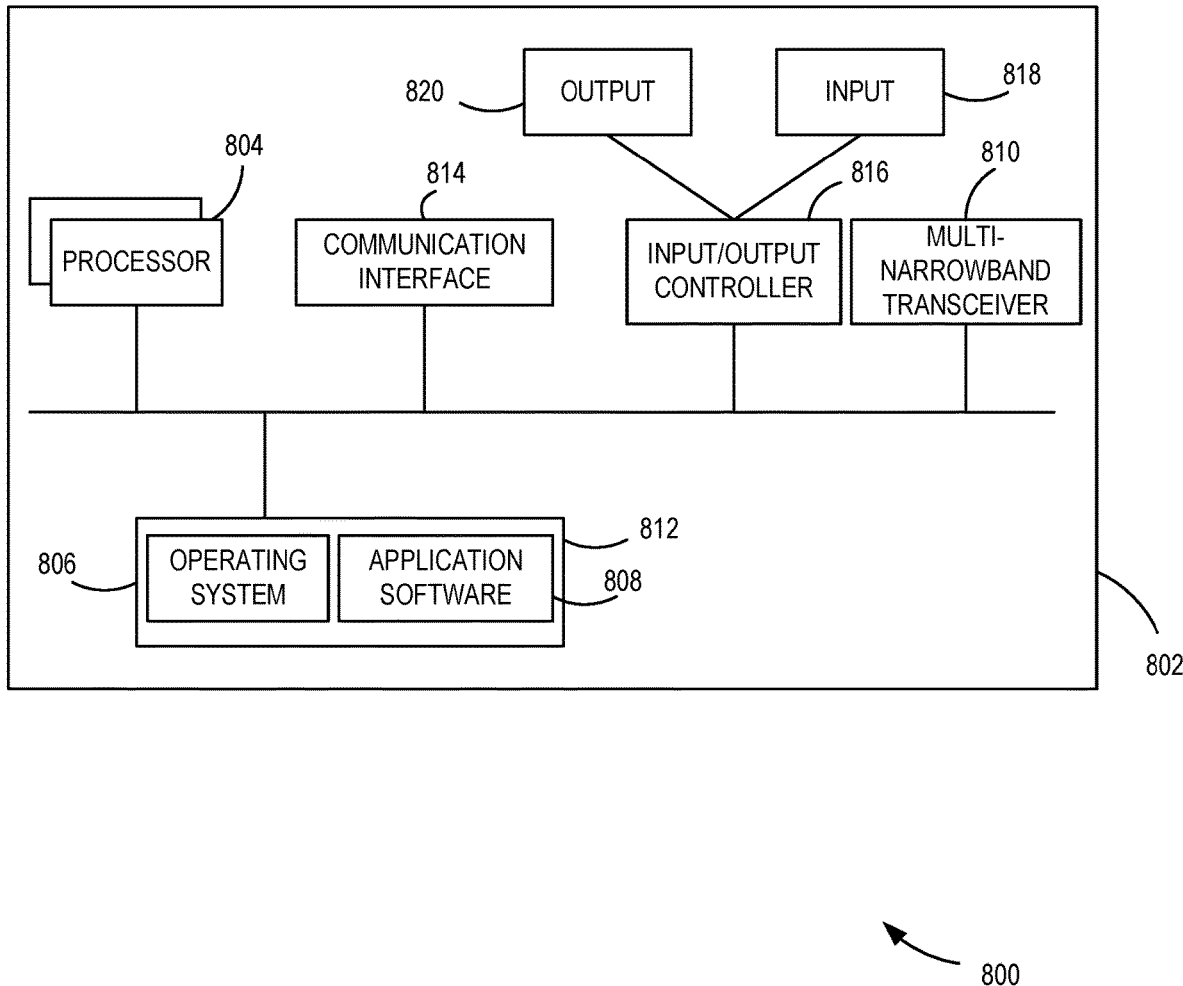
FIG. 8 illustrates a computing apparatus according to example as a functional block diagram.

The present disclosure is operable with a computing apparatus 802 according to an example as a functional block diagram 800 in FIG. 8, such as an IoT device. In one example, components of the computing apparatus 802 may be implemented as a part of an electronic device according to one or more examples described in this disclosure. The computing apparatus 802 comprises one or more processors 804 which may be microprocessors, controllers or any other suitable type of processors for processing computer executable instructions to control the operation of the computing apparatus 802. Platform software comprising an operating system 806 or any other suitable platform software may be provided on the computing apparatus 802 to enable application software 808 to be executed on the computing apparatus 802. According to an example, communication via a multi-narrowband transceiver 810, such as implemented with an IoT client device, may be accomplished by software and/or hardware.

Computer executable instructions may be provided using any computer-readable media that are accessible by the computing apparatus 802. Computer-readable media may include, for example, computer storage media such as a memory 812 and communications media. Computer storage media, such as the memory 812, include volatile and non-volatile, removable and non-removable media implemented in any method or technology for storage of information such as computer readable instructions, data structures, program modules or the like. Computer storage media include, but are not limited to, RAM, ROM, EPROM, EEPROM, flash memory or other memory technology, CD-ROM, digital versatile disks (DVD) or other optical storage, magnetic cassettes, magnetic tape, magnetic disk storage or other magnetic storage devices, or any other non-transmission medium that can be used to store information for access by a computing apparatus. In contrast, communication media may embody computer readable instructions, data structures, program modules, or the like in a modulated data signal, such as a carrier wave, or other transport mechanism. As defined herein, computer storage media do not include communication media. Therefore, a computer storage medium should not be interpreted to be a propagating signal per se. Propagated signals per se are not examples of computer storage media. Although the computer storage medium (the memory 812) is shown within the computing apparatus 802, it will be appreciated by a person skilled in the art, that the storage may be distributed or located remotely and accessed via a network or other communication link (e.g. using a communication module, such as a communication interface 814).

The computing apparatus 802 in one example includes an input/output controller 816 configured to output information to one or more input devices 818 and output devices 820, for example a display or a speaker, which may be separate from or integral to the electronic device. The input/output controller 816 in some examples is configured to receive and process an input from one or more input devices 818, such as a control button or touchpad. In one example, the output device 820 acts as the input device 818. An example of such a device may be a touch sensitive display. The input/output controller 816 in one example also outputs data to devices other than the output device 820, e.g. a locally connected printing device. In some examples, a user provides input to the input device(s) 818 and/or receives output from the output device(s) 820.

In one example, the computing apparatus 802 detects voice input, user gestures or other user actions and provides a natural user interface (NUI). This user input is used to author electronic ink, view content, select ink controls, play videos with electronic ink overlays and for other purposes.

The input/output controller 816 outputs data to devices other than a display device in some examples, e.g. a locally connected printing device.

The functionality described herein can be performed, at least in part, by one or more hardware logic components. According to an example, the computing apparatus 802 is configured by the program code when executed by the processor(s) 804 to execute the example of the operations and functionality described. Alternatively, or in addition, the functionality described herein can be performed, at least in part, by one or more hardware logic components. For example, and without limitation, illustrative types of hardware logic components that can be used include Field-programmable Gate Arrays (FPGAs), Application-specific Integrated Circuits (ASICs), Program-specific Standard Products (ASSPs), System-on-a-chip systems (SOCs), Complex Programmable Logic Devices (CPLDs), Graphics Processing Units (GPUs).

At least a portion of the functionality of the various elements in the figures may be performed by other elements in the figures, or an entity (e.g., processor, web service, server, application program, computing device, etc.) not shown in the figures. Additionally, in some aspects, the computing apparatus 802 is a lower power device (e.g., LoRa) having multi-narrowband communication capabilities over the TVWS frequency spectrum.

Although described in connection with an exemplary computing system environment, examples of the disclosure are capable of implementation with numerous other general purpose or special purpose computing system environments, configurations, or devices.

Examples of well-known computing systems, environments, and/or configurations that may be suitable for use with aspects of the disclosure include, but are not limited to, mobile or portable computing devices (e.g., smartphones), personal computers, server computers, hand-held (e.g., tablet) or laptop devices, multiprocessor systems, gaming consoles or controllers, microprocessor-based systems, set top boxes, programmable consumer electronics, mobile telephones, mobile computing and/or communication devices in wearable or accessory form factors (e.g., watches, glasses, headsets, or earphones), network PCs, minicomputers, mainframe computers, distributed computing environments that include any of the above systems or devices, and the like. In general, the disclosure is operable with any device with processing capability such that it can execute instructions such as those described herein. Such systems or devices may accept input from the user in any way, including from input devices such as a keyboard or pointing device, via gesture input, proximity input (such as by hovering), and/or via voice input.

Examples of the disclosure may be described in the general context of computer-executable instructions, such as program modules, executed by one or more computers or other devices in software, firmware, hardware, or a combination thereof. The computer-executable instructions may be organized into one or more computer-executable components or modules. Generally, program modules include, but are not limited to, routines, programs, objects, components, and data structures that perform particular tasks or implement particular abstract data types. Aspects of the disclosure may be implemented with any number and organization of such components or modules. For example, aspects of the disclosure are not limited to the specific computer-executable instructions or the specific components or modules illustrated in the figures and described herein. Other examples of the disclosure may include different computer-executable instructions or components having more or less functionality than illustrated and described herein.

In examples involving a general-purpose computer, aspects of the disclosure transform the general-purpose computer into a special-purpose computing device when configured to execute the instructions described herein.

A device for TV white space (TVWS) communication comprises a multiband transmitter and a multiband receiver; an antenna, the multiband transmitter and the multiband receiver connected to the antenna and configured to transmit and receive at a plurality of TVWS frequencies; and a log periodic filter connected between the multiband transmitter and the antenna, the log periodic filter comprising a plurality of filter elements each having a filter frequency increasing periodically in a same frequency increasing factor (K), each filter of the plurality of filter elements configured to filter out second harmonics in a defined frequency range. The defined frequency range may include the TVWS spectrum, or another range such as 150-960 Mhz (which is more than the TVWS spectrum, and includes the land mobile radio (LMR) band and some ISM bands).

A base station for TV white space (TVWS) communication comprises a master transceiver; a plurality of subordinate transceivers, wherein the master transceiver and the plurality of subordinate transceivers are interconnected, the master transceiver and the plurality of subordinate transceivers configured to transmit and receive at a plurality of TVWS frequencies; an antenna connected to the master transceiver and the plurality of subordinate transceivers; an RF combiner/splitter connected between the antenna and the master transceiver and the plurality of subordinate transceivers; and a log periodic filter within the master transceiver and the plurality of subordinate transceivers, the log periodic filter comprising a plurality of filter elements each having a filter frequency increasing periodically in a same frequency increasing factor (K), each filter of the plurality of filter elements configured to filter out second harmonics in a defined frequency range.

A computerized method for TV white space (TVWS) communication comprises configuring a multi-narrowband transceiver for communication within the TVWS frequency spectrum using a log periodic filter, the log periodic filter comprising a plurality of filter elements each having a filter frequency increasing periodically in a same frequency increasing factor (K), each filter of the plurality of filter elements configured to filter out second harmonics in a defined frequency range within the TVWS frequency spectrum; determining a TVWS channel for the communication; switching to a filter element of the plurality of filter elements corresponding to the determined TVWS channel; and at least one of transmitting and receiving over the TVWS channel using the filter element.

A computerized method for interference sensing with a signal generator, the computerized method comprising:
 setting one or more multi-narrowband transceivers and the signal generator to operate at a same frequency and a same modulation scheme;
 transmitting with the signal generator, an RF signal;
 determining an interference using an antenna;
 combining the interference with the RF signal from the signal generator to generate a combined signal;
 feeding the combined signal into a port of the one or more multi-narrowband transceivers;
 receiving the combined signal with a receiver of the one or more multi-narrowband transceivers;
 measuring at least one of an RSSI or SNR of the received combined signal;
 recording the at least one measured RSSI or SNR;
 reducing a strength of the RF signal; and
 repeating the transmitting, determining, combining, feeding, receiving, measuring, recording, and reducing until the one or more multi-narrowband transceivers do not detect the combined signal, which identifies an MDS to use.

Alternatively, or in addition to the other examples described herein, examples include any combination of the following:
 wherein the plurality of filter elements comprises only five filter elements;
 wherein the frequency increasing factor (K) is 1.45;
 wherein the plurality of filter elements is configured to filter out second harmonics in a frequency range of 150 MHz to 960 MHz;
 wherein the multiband transmitter and the multiband receiver are configured to operate using a long range communication protocol;
 further comprising a low-noise amplifier (LNA) connected between the multiband receiver and the antenna;
 wherein the multiband transmitter and the multiband receiver are configured to perform Internet of Things (IoT) communications;
 wherein the master transceiver is configured to generate a control command to synchronize transmission or reception of the plurality of subordinate transceivers in a same time slot;
 wherein the control command comprises one of an analog high signal and an analog low signal, or a digital high signal and a digital low signal;
 further comprising a signal generator connected to the RF combiner/splitter and configured to generate a signal and reduce a signal strength of the signal until a minimum detectable signal (MDS) under interference is obtained to identify an available TVWS channel;
 further comprising a power amplifier and a low-noise amplifier selectively connected between the RF combiner/splitter and the antenna;
 wherein the master transceiver and the plurality of subordinate transceivers are configured to communicate with a plurality of Internet of Things (IoT) devices; and
 wherein the master transceiver and the plurality of subordinate transceivers are configured to operate using a long range communication protocol.

Any range or device value given herein may be extended or altered without losing the effect sought, as will be apparent to the skilled person.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

It will be understood that the benefits and advantages described above may relate to one example or may relate to several examples. The examples are not limited to those that solve any or all of the stated problems or those that have any or all of the stated benefits and advantages. It will further be understood that reference to 'an' item refers to one or more of those items.

The examples illustrated and described herein as well as examples not specifically described herein but within the scope of aspects of the claims constitute exemplary means for device communication using the TVWS spectrum.

The term "comprising" is used in this specification to mean including the feature(s) or act(s) followed thereafter, without excluding the presence of one or more additional features or acts.

In some examples, the operations illustrated in the figures may be implemented as software instructions encoded on a computer readable medium, in hardware programmed or designed to perform the operations, or both. For example, aspects of the disclosure may be implemented as a system on a chip or other circuitry including a plurality of interconnected, electrically conductive elements.

The order of execution or performance of the operations in examples of the disclosure illustrated and described herein is not essential, unless otherwise specified. That is, the operations may be performed in any order, unless otherwise specified, and examples of the disclosure may include additional or fewer operations than those disclosed herein. For example, it is contemplated that executing or performing a particular operation before, contemporaneously with, or after another operation is within the scope of aspects of the disclosure.

When introducing elements of aspects of the disclosure or the examples thereof, the articles "a," "an," "the," and "said" are intended to mean that there are one or more of the elements. The terms "comprising," "including," and "having" are intended to be inclusive and mean that there may be additional elements other than the listed elements. The term "exemplary" is intended to mean "an example of" The phrase "one or more of the following: A, B, and C" means "at least one of A and/or at least one of B and/or at least one of C."

Having described aspects of the disclosure in detail, it will be apparent that modifications and variations are possible without departing from the scope of aspects of the disclosure as defined in the appended claims. As various changes could be made in the above constructions, products, and methods without departing from the scope of aspects of the disclosure, it is intended that all matter contained in the above description and shown in the accompanying drawings shall be interpreted as illustrative and not in a limiting sense.

What is claimed is:

1. A base station for television white space (TVWS) communication, the base station comprising:
   a master transceiver;
   a plurality of subordinate transceivers, wherein the master transceiver and the plurality of subordinate transceivers are interconnected, the master transceiver and the plurality of subordinate transceivers configured to transmit and receive at a plurality of TVWS frequencies;
   an antenna connected to the master transceiver and the plurality of subordinate transceivers;
   a radio frequency (RF) combiner/splitter connected between the antenna and the master transceiver and the plurality of subordinate transceivers; and
   a log periodic filter within the master transceiver and the plurality of subordinate transceivers, the log periodic filter comprising a plurality of filter elements each having a filter frequency increasing periodically in a same frequency increasing factor, each filter of the plurality of filter elements configured to filter out second harmonics in a defined frequency range.

2. The base station of claim 1, wherein the master transceiver is configured to generate a control command to synchronize transmission or reception of the plurality of subordinate transceivers in a same time slot.

3. The base station of claim 2, wherein the control command comprises one of an analog high signal and an analog low signal, or a digital high signal and a digital low signal.

4. The base station of claim 1, further comprising a signal generator connected to the RF combiner/splitter and configured to generate a signal and reduce a signal strength of the signal until a minimum detectable signal (MDS) under interference is obtained to identify an available TVWS channel.

5. The base station of claim 1, further comprising a power amplifier and a low-noise amplifier selectively connected between the RF combiner/splitter and the antenna.

6. The base station of claim 1, wherein the master transceiver and the plurality of subordinate transceivers are configured to communicate with a plurality of Internet of Things (IoT) devices.

7. The base station of claim 1, wherein the master transceiver and the plurality of subordinate transceivers are configured to operate using a long range communication protocol.

8. A system for television white space (TVWS) communication, the system comprising:
   a master transceiver;
   a plurality of subordinate transceivers, wherein the master transceiver and the plurality of subordinate transceivers are interconnected, the master transceiver and the plurality of subordinate transceivers configured to transmit and receive at a plurality of TVWS frequencies;
   an antenna connected to the master transceiver and the plurality of subordinate transceivers;
   a radio frequency (RF) combiner/splitter connected between the antenna and the master transceiver and the plurality of subordinate transceivers; and
   a log periodic filter within the master transceiver and the plurality of subordinate transceivers, the log periodic filter comprising a plurality of filter elements each having a filter frequency increasing periodically in a same frequency increasing factor, each filter of the plurality of filter elements configured to filter out second harmonics in a defined frequency range.

9. The system of claim 8, wherein the master transceiver is configured to generate a control command to synchronize transmission or reception of the plurality of subordinate transceivers in a same time slot.

10. The system of claim 9, wherein the control command comprises one of an analog high signal and an analog low signal, or a digital high signal and a digital low signal.

11. The system of claim 8, further comprising a signal generator connected to the RF combiner/splitter and configured to generate a signal and reduce a signal strength of the signal until a minimum detectable signal (MDS) under interference is obtained to identify an available TVWS channel.

12. The system of claim 8, further comprising a power amplifier and a low-noise amplifier selectively connected between the RF combiner/splitter and the antenna.

13. The system of claim 8, wherein the master transceiver and the plurality of subordinate transceivers are configured to communicate with a plurality of Internet of Things (IOT) devices.

14. A computerized method for television white space (TVWS) communication, the computerized method comprising:
   configuring a master transceiver to transmit and receive at a plurality of TVWS frequencies using time-division multiple access (TDMA) with synchronization of transmit and receive operations;

configuring a plurality of subordinate transceivers to transmit and receive at the plurality of TVWS frequencies using the TDMA with synchronization of the transmit and receive operations, wherein the master transceiver and the plurality of subordinate transceivers are interconnected, wherein the master transceiver controls when the plurality of subordinate transceivers transmit and receive;

receiving a signal indicating the plurality of subordinate transceivers should operate in at least one of a transmit or receive mode; and based on the received signal, at least one of transmitting and receiving over the TVWS frequencies using the TDMA to expand communication capabilities over a particular channel.

15. The computerized method of claim 14, wherein the received signal is a high voltage signal indicating that the plurality of subordinate transceivers should switch to a transmit mode.

16. The computerized method of claim 14, wherein the received signal is a low voltage signal indicating that the plurality of subordinate transceivers should switch to a receive mode.

17. The computerized method of claim 14, wherein a general-purpose input/output (GPIO) pin of the master transceiver sends transmit or receive control signals to the plurality of subordinate transceivers.

18. The computerized method of claim 17, wherein a reset pin is connected to the GPIO pin to control resetting of the master transceiver and the plurality of subordinate transceivers.

19. The computerized method of claim 14, further comprising:

configuring a signal generator to operate at the plurality of TVWS frequencies with a same modulation scheme as the master transceiver and the plurality of subordinate transceivers, the signal generator transmitting a beacon transmission.

20. The computerized method of claim 19, further comprising:

detecting the beacon transmission from the signal generator;

detecting interference associated with the beacon transmission;

combining the detected interference with the beacon transmission from the signal generator;

inputting the combined detected interference with the beacon transmission into a port of at least one of the plurality of subordinate transceivers, wherein the at least one subordinate transceiver records a received signal strength indicator (RSSI) and/or signal-to-noise ratio (SNR), and wherein the signal generator reduces a strength of the beacon transmission with iterative transmissions; and iteratively repeating the detecting, combining, and inputting until the at least one subordinate transceiver is unable to detect the beacon transmission, wherein a lowest RSSI recorded is identified as a minimum detectable signal (MDS) of the at least one subordinate transceiver.

* * * * *